United States Patent
Nakamura

(10) Patent No.: US 11,837,433 B2
(45) Date of Patent: Dec. 5, 2023

(54) METHOD OF MEASURING RELATIVE ROTATIONAL ANGLE AND SCANNING TRANSMISSION ELECTRON MICROSCOPE

(71) Applicant: JEOL Ltd., Tokyo (JP)

(72) Inventor: Akiho Nakamura, Tokyo (JP)

(73) Assignee: JEOL Ltd., Tokyo (JP)

( * ) Notice: Subject to any disclaimer, the term of this patent is extended or adjusted under 35 U.S.C. 154(b) by 185 days.

(21) Appl. No.: 17/669,503

(22) Filed: Feb. 11, 2022

(65) Prior Publication Data

US 2022/0262597 A1   Aug. 18, 2022

(30) Foreign Application Priority Data

Feb. 12, 2021   (JP) ................... 2021-020790

(51) Int. Cl.
  *H01J 37/26* (2006.01)
  *H01J 37/28* (2006.01)
  *H01J 37/147* (2006.01)

(52) U.S. Cl.
  CPC ........ *H01J 37/265* (2013.01); *H01J 37/1474* (2013.01); *H01J 37/28* (2013.01); *H01J 2237/2802* (2013.01); *H01J 2237/2804* (2013.01)

(58) Field of Classification Search
  CPC .. H01J 37/00; H01J 37/02; H01J 37/26; H01J 37/265; H01J 37/268; H01J 37/147; H01J 37/1478; H01J 37/1474; H01J 37/28; H01J 2237/2802; H01J 2237/2804; H01J 2237/1505; H01J 2237/24514

USPC ..................... 250/306, 307, 311
See application file for complete search history.

(56) References Cited

U.S. PATENT DOCUMENTS

| | | | |
|---|---|---|---|
| 2010/0033560 A1* | 2/2010 | Kawasaki | G01N 23/203 250/306 |
| 2018/0158646 A1 | 6/2018 | Nakamura | |
| 2020/0411281 A1* | 12/2020 | Yamaguchi | G01B 15/02 |

FOREIGN PATENT DOCUMENTS

JP            201892805 A    6/2018

* cited by examiner

*Primary Examiner* — Jason L McCormack
(74) *Attorney, Agent, or Firm* — THE WEBB LAW FIRM

(57) ABSTRACT

A method of measuring a relative rotational angle includes: shifting an electron beam on a specimen plane by using a deflector; tilting the electron beam with respect to the specimen plane by using the deflector; acquiring a first STEM image including information of a scattering azimuth angle and a second STEM image not including the information of the scattering azimuth angle, before the shifting and the tilting; acquiring a third STEM image including the information of the scattering azimuth angle and a fourth STEM image not including the information of the scattering azimuth angle, after the shifting and the tilting; and obtaining the relative rotational angle based on the first STEM image, the second STEM image, the third STEM image and the fourth STEM image.

9 Claims, 19 Drawing Sheets

METHOD OF MEASURING RELATIVE ROTATIONAL ANGLE AND SCANNING TRANSMISSION ELECTRON MICROSCOPE

CROSS-REFERENCE TO RELATED APPLICATION

This application claims priority to Japanese Patent Application No. 2021-020790 filed Feb. 12, 2021, the disclosure of which is hereby incorporated by reference in its entirety.

BACKGROUND OF THE INVENTION

Field of the Invention

The present invention relates to a method of measuring a relative rotational angle and a scanning transmission electron microscope.

Description of Related Art

With a transmission electron microscope and a scanning transmission electron microscope, data of a real space and data of a reciprocal space can be acquired.

Information of the real space mainly includes a form of a specimen, a size of the specimen, a positional relationship on the specimen, and a defect structure. The data including the information of the real space which can be acquired by the transmission electron microscope includes specimen images such as a bright-field image, a dark-field image, a high-resolution TEM image and the like. The data including the information of the real space which can be acquired by the scanning transmission electron microscope includes specimen images such as a bright-field STEM image, an annular dark-field STEM image and the like.

The information of the reciprocal space mainly includes crystal structures, symmetricity of crystal, occupation rate of atoms, crystal order of medium-to-long distance, and scattering azimuth. The data including information of the reciprocal space that can be acquired by a transmission electron microscope includes electron diffraction figures. The data including the information of the reciprocal space that can be acquired by the scanning transmission electron microscope includes a DPC (Differential Phase Contrast)-STEM image disclosed in JP-A-2018-092805, for example. In the scanning transmission electron microscope, an electron diffraction figure can be acquired at each position of an electronic probe which performs scanning on a specimen. Pixel-type detectors such as a split-type detectors, CCD cameras and the like are used for acquisition of the electron diffraction figures.

In analysis of the data acquired by the transmission electron microscope and the scanning transmission electron microscope, association between the information of the real space and the information of the reciprocal space is extremely important. In the transmission electron microscope, for example, local information such as a grating defect, a phase interface and the like can be associated with the crystal structure by accurately matching a relationship in azimuths between a specimen image and an electron diffraction figure. Moreover, in the scanning transmission electron microscope, many methods including complicated post treatments such as the DPC method disclosed in JP-A-2018-092805 are utilized, and the azimuth relationship between the specimen image and the electron diffraction figure is an important parameter directly influencing an analysis result.

For example, in the transmission electron microscope, even if an image observation mode and an electron diffraction mode are switched over, the azimuths of the specimen image and the electron diffraction figure can be matched by adjusting an image-forming system lens so that an image is not rotated. That is, a relative rotational angle between an image plane (specimen plane) and a diffraction plane (detection plane) can be brought to 0 degrees. Therefore, the information of the real space can be associated with the information of the reciprocal space.

In the scanning transmission electron microscope, a scanning direction of an electron beam on the specimen can be also rotated arbitrarily (scan rotation). By performing the scan rotation, a direction of the specimen image can be changed. When the scan rotation is performed, though an observation field is rotated, a direction of the specimen with respect to an entire optical system or an azimuth of the electron diffraction figure with respect to the entire optical system is not changed.

Thus, in the scanning transmission electron microscope, in order to know the relative rotational angle between the image plane formed on the specimen plane and the diffraction plane formed on the detection plane, not only rotation of an image by the image-forming system lens disposed between the specimen plane and the detection plane but also rotation of an image by the scan rotation should be considered.

Therefore, in the scanning transmission electron microscope, it has been difficult to know the relative rotational angle between the image plane and the diffraction plane.

SUMMARY OF THE INVENTION

According to the first aspect of the invention, there is provided a method of measuring, in a scanning transmission electron microscope including a deflector that deflects an electron beam with which a specimen is illuminated and a detector that is capable of detecting a scattering azimuth angle of electrons scattered by an electromagnetic field of the specimen, a relative rotational angle between an image plane on which the specimen is disposed and a diffraction plane on which the detector is disposed, the method including:
  shifting an electron beam on a specimen plane by using the deflector;
  tilting the electron beam with respect to the specimen plane by using the deflector;
  acquiring a first STEM image including information of the scattering azimuth angle and a second STEM image not including the information of the scattering azimuth angle, before the shifting and the tilting;
  acquiring a third STEM image including the information of the scattering azimuth angle and a fourth STEM image not including the information of the scattering azimuth angle, after the shifting and the tilting; and
  obtaining the relative rotational angle based on the first STEM image, the second STEM image, the third STEM image and the fourth STEM image.

According to the second aspect of the invention, there is provided a scanning transmission electron microscope including:
  an illumination-system lens through which a specimen is illuminated with an electron beam;
  a deflector that deflects an electron beam with which the specimen is illuminated;
  an image-forming system lens that forms an image with the electron beam transmitted through the specimen;

a detector that is capable of detecting a scattering azimuth angle of electrons scattered by an electromagnetic field of the specimen; and a calculation portion that calculates a relative rotational angle between an image plane on which the specimen is disposed and a diffraction plane on which the detector is disposed, the calculation portion performing processing of:

acquiring a first STEM image including information of the scattering azimuth angle and a second STEM image not including the information of the scattering azimuth angle, the information having been acquired before the electron beam is shifted on a specimen plane by using the deflector and tilted with respect to the specimen plane by using the deflector;

acquiring a third STEM image including the information of the scattering azimuth angle and a fourth STEM image not including the information of the scattering azimuth angle, the information having been acquired after the electron beam is shifted on the specimen plane by using the deflector and tilted with respect to the specimen plane by using the deflector; and obtaining the relative rotational angle based on the first STEM image, the second STEM image, the third STEM image and the fourth STEM image.

DESCRIPTION OF THE INVENTION

Figure 1:
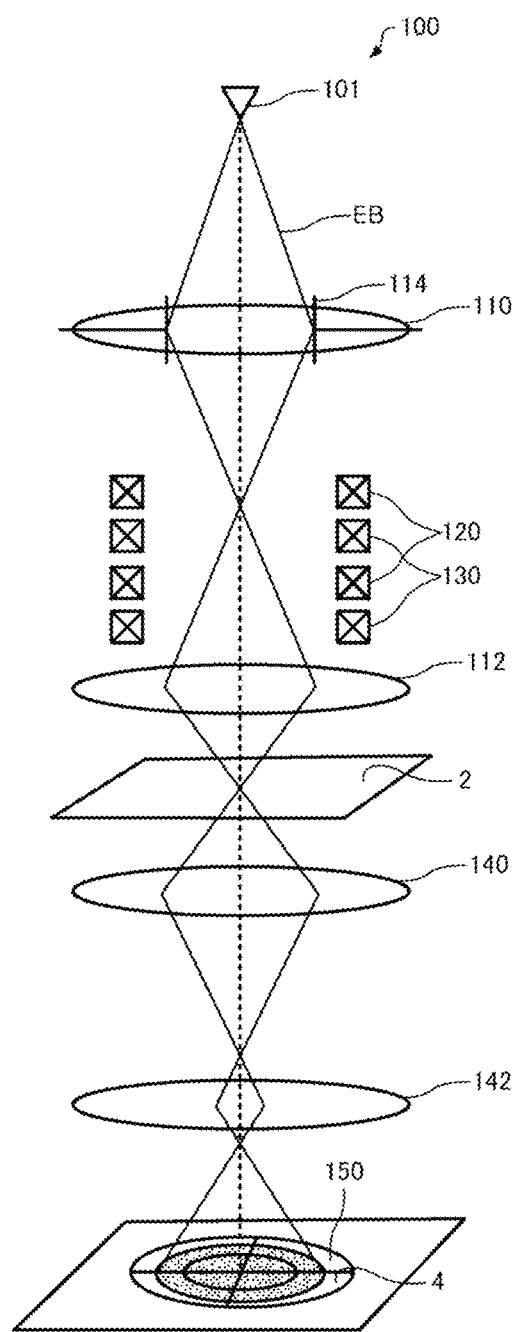
FIG. 1 is a diagram illustrating a configuration of a scanning transmission electron microscope used in the method of measuring a relative rotational angle according to the first embodiment.

According to an embodiment of the invention, there is provided a method of measuring, in a scanning transmission electron microscope including a deflector that deflects an electron beam with which a specimen is illuminated and a detector that is capable of detecting a scattering azimuth angle of electrons scattered by an electromagnetic field of the specimen, a relative rotational angle between an image plane on which the specimen is disposed and a diffraction plane on which the detector is disposed, the method including:

shifting an electron beam on a specimen plane by using the deflector;

tilting the electron beam with respect to the specimen plane by using the deflector;

acquiring a first STEM image including information of the scattering azimuth angle and a second STEM image not including the information of the scattering azimuth angle, before the shifting and the tilting;

acquiring a third STEM image including the information of the scattering azimuth angle and a fourth STEM image not including the information of the scattering azimuth angle, after the shifting and the tilting; and obtaining the relative rotational angle based on the first STEM image, the second STEM image, the third STEM image and the fourth STEM image.

In the method of measuring a relative rotational angle as above, the relative rotational angle between the image plane on which the specimen is disposed, and the diffraction plane on which the detector is disposed can be acquired based on the first STEM image, the second STEM image, the third STEM image and the fourth STEM image. Therefore, with the method of measuring a relative rotational angle as above, the relative rotational angle can be acquired easily.

According to an embodiment of the invention, there is provided a scanning transmission electron microscope including:

an illumination-system lens through which a specimen is illuminated with an electron beam;

a deflector that deflects the electron beam with which the specimen is illuminated;

an image-forming system lens that forms an image with the electron beam transmitted through the specimen;

a detector that is capable of detecting a scattering azimuth angle of electrons scattered by an electromagnetic field of the specimen; and a calculation portion that calculates a relative rotational angle between an image plane on which the specimen is disposed and a diffraction plane on which the detector is disposed, the calculation portion performing processing of:
acquiring a first STEM image including information of the scattering azimuth angle and a second STEM image not including the information of the scattering azimuth angle, the information having been acquired before the electron beam is shifted on a specimen plane by using the deflector and tilted with respect to the specimen plane by using the deflector;

acquiring a third STEM image including the information of the scattering azimuth angle and a fourth STEM image not including the information of the scattering azimuth angle, the information having been acquired after the electron beam is shifted on the specimen plane by using the deflector and tilted with respect to the specimen plane by using the deflector; and obtaining the relative rotational angle based on the first STEM image, the second STEM image, the third STEM image and the fourth STEM image.

In the scanning transmission electron microscope as above, the relative rotational angle between the image plane on which the specimen is disposed and the diffraction plane on which the detector is disposed can be acquired based on the first STEM image, the second STEM image, the third STEM image and the fourth STEM image. Therefore, with the scanning transmission electron microscope as above, the relative rotational angle can be acquired easily.

Preferred embodiments of the invention are described in detail below with reference to the drawings. It is noted that the following embodiments do not unduly limit the scope of the invention as stated in the claims. In addition, all of the components described in the following embodiments are not necessarily essential requirements of the invention.

1. First Embodiment 1.1. Configuration of Scanning Transmission Electron Microscope A method of measuring a relative rotational angle between an image plane on which a specimen is disposed and a diffraction plane on which a detector is disposed according to the first embodiment (hereinafter, simply referred to also as "the relative rotational angle") will be described. In the following, first, a scanning transmission electron microscope (STEM) used for the method of measuring the relative rotational angle according to the first embodiment will be described by referring to the figures. FIG. 1 is a diagram illustrating a configuration of the scanning transmission electron microscope 100 used for the method of measuring the relative rotational angle according to the first embodiment.

The scanning transmission electron microscope 100 includes, as illustrated in FIG. 1, an electron source 101, a first illumination-system lens 110, a second illumination-system lens 112, an illumination-system aperture 114, a deflector 120, a scanning coil 130, a first image-forming system lens 140, a second image-forming system lens 142, and a detector 150.

The electron source 101 generates an electron beam EB. The electron source 101 is an electron gun which causes electrons to be emitted from a cathode and to be accelerated toward an anode, whereby the electron beam EB is created, for example.

The first illumination-system lens 110 and the second illumination-system lens 112 focus the electron beams EB emitted from the electron source 101, and the specimen disposed on a specimen plane 2 is illuminated with them through the first and second illumination-system lenses 110 and 112. By focusing the electron beams EB by the first illumination-system lens 110 and the second illumination-system lens 112, an electron probe is formed. The second illumination-system lens 112 includes a front magnetic field of an object lens.

The illumination-system aperture 114 is disposed on the first illumination-system lens 110. The illumination-system aperture 114 cuts unnecessary electron beams EB.

The deflector 120 two-dimensionally deflects the electron beam EB with which the specimen is illuminated. By deflecting the electron beam EB by the deflector 120, the electron beam EB can be shifted on the specimen plane 2. Moreover, by deflecting the electron beam EB by the deflector 120, the electron beam EB can be tilted with respect to the specimen plane 2. The deflector 120 is constituted by two stages of deflection coils in an illustrated example. By interlocking the two stages of the deflection coils, the electron beam EB can be subjected to simple shifting and simple tilting. The simple shifting and the simple tilting will be described later.

The scanning coil 130 is a coil which two-dimensionally deflects the electron beam EB and scans the specimen with the electron beam EB.

The first image-forming system lens 140 and the second image-forming system lens 142 form images with the electron beam EB transmitted through the specimen. An image is enlarged by the first image-forming system lens 140 and the second image-forming system lens 142, and an electron diffraction figure in which certain image rotation is applied to a specimen plane 2 (image plane) is transferred to a detection plane 4 (diffraction plane). In this way, the diffraction plane on which the detector 150 is disposed is rotated with respect to the image plane on which the specimen is disposed by a lens action of the first image-forming system lens 140 and the second image-forming system lens 142 disposed between the specimen plane 2 and the detection plane 4.

The detector 150 is disposed on the diffraction plane formed by the second image-forming system lens 142. Specifically, the detector 150 has the detection plane 4, and the detection plane 4 is disposed on the diffraction plane. The detection plane 4 is a plane on which the electron beam EB transmitted through the specimen is detected.

The detector 150 detects an electron diffraction figure transferred by the first image-forming system lens 140 and the second image-forming system lens 142. The detector 150 is a detector which can detect a scattering azimuth angle of electrons scattered by an electromagnetic field of the specimen (hereinafter, simply referred to also as a "scattering azimuth angle"). The detector 150 is a split-type detector, for example. The split-type detector is a detector whose detection plane 4 is split into a plurality of detection regions. Each of the detection regions can independently detect the electron.

Note that a case in which the detector 150 is a split-type detector is described here, but the detector 150 is not particularly limited as long as it is a detector which can detect the scattering azimuth angle. For example, the detector 150 may be a pixel-type detector such as a CCD camera.

Figure 2:
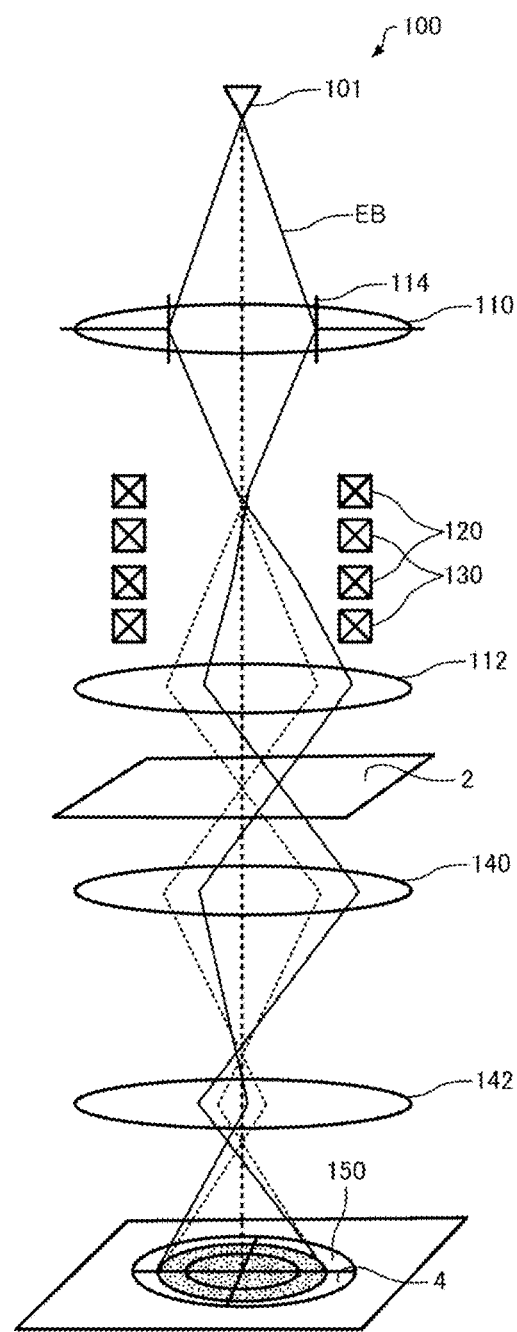
FIG. 2 is a light-beam diagram when an electron beam is subjected to simple shifting by a deflector.

FIG. 2 is a light beam diagram when the electron beam EB is subjected to simple shifting by the deflector 120. The simple shifting refers to shifting of the electron beam EB on the specimen plane 2 without changing an inclination angle of the electron beam EB with respect to the specimen plane 2. As illustrated in FIG. 2, when the electron beam EB is subjected to the simple shifting by the deflector 120, even if a position of the electron beam EB is changed on the specimen plane 2, a position of a transmission disc is not changed on the detection plane 4. The transmission disc is a disc indicating a transmission wave on the electron diffraction figure.

Figure 3:
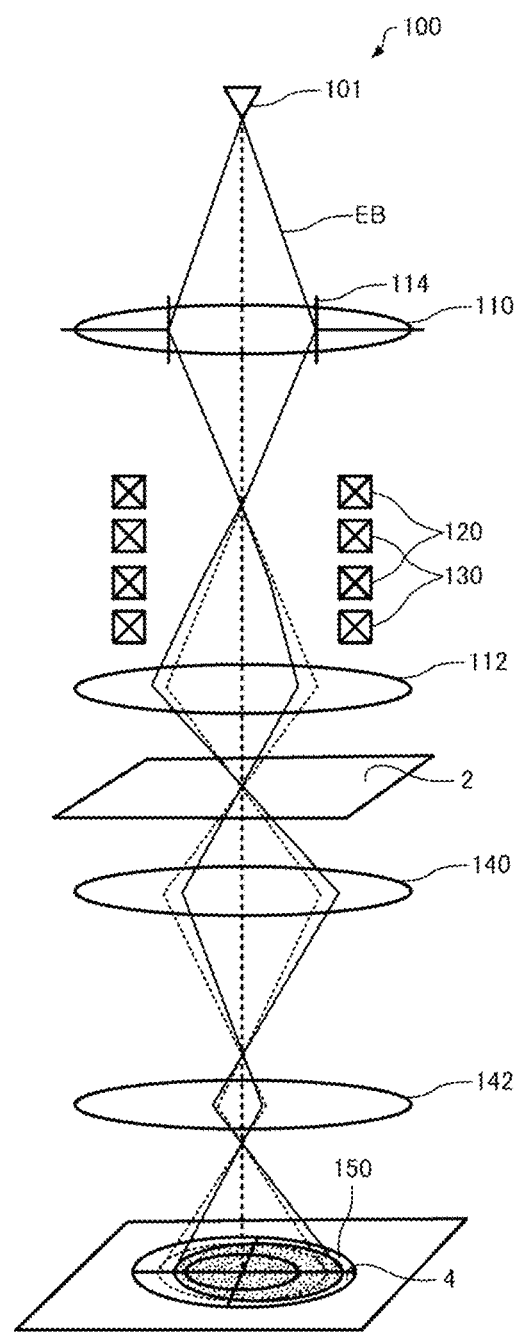
FIG. 3 is a light-beam diagram when an electron beam is subjected to simple tilting by a deflector.

FIG. 3 is a light beam diagram when the electron beam EB is subjected to the simple tilting by the deflector 120. As illustrated in FIG. 3, the simple tilting refers to a change of the inclination angle of the electron beam EB with respect to the specimen plane 2 without shifting the electron beam EB on the specimen plane 2. When the electron beam EB is subjected to the simple tilting by the deflector 120, the position of the electron beam EB is not changed on the specimen plane 2, but the position of the transmission disc is changed on the detection plane 4. This shift of the transmission disc can be detected by a differential phase contrast imaging method (DPC method).

The DPC method is one type of the STEM method which visualizes the electromagnetic field in the specimen by measuring deflection of the electron beam by the electromagnetic field in the specimen at each position on the specimen. For example, by taking a difference of opposing detection regions by the split-type detector, a deflection amount and a deflection direction of the electron beam can be detected at each position on the specimen. Hereinafter, the DPC method will be described by referring to the figures.

Figure 4:
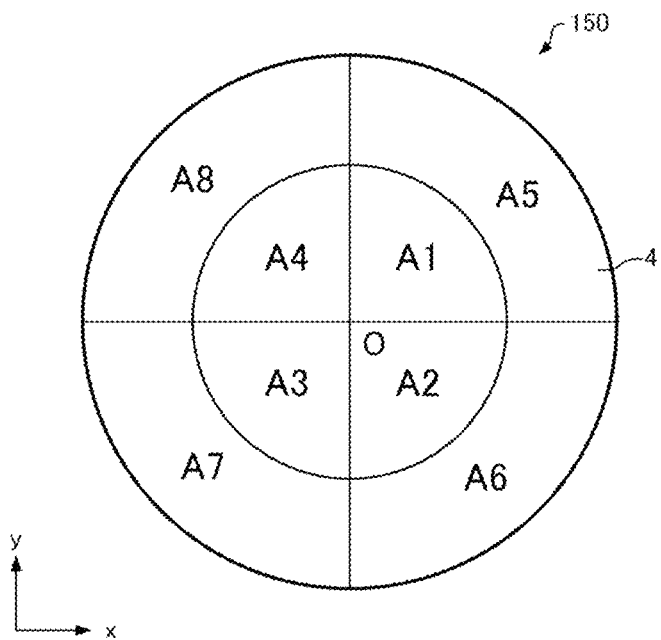
FIG. 4 is a plan view schematically illustrating a detection plane of a detector.

FIG. 4 is a plan view schematically illustrating the detection plane 4 of the detector 150.

As illustrated in FIG. 4, since the detection plane 4 is divided into two parts in a radius vector direction and four parts in a deflection angle direction, eight detection regions A1 to A8 are formed. Note that, the number of the detection regions is not particularly limited as long as it is 2 or more.

For example, information of the deflection amount of the electron beam EB by the electromagnetic field in the specimen in a direction connecting the detection region A5 and the detection region A7 can be acquired from a difference I5-I7 between a signal amount I5 of the detection region A5 and the signal amount I7 of the detection region A7 which is symmetric with the detection region A5 with respect to a center O of the detection plane 4.

Moreover, the information of the deflection amount of the electron beam EB by the electromagnetic field in the specimen in a direction where the detection region A6 and the detection region A8 are connected can be acquired from a difference I6-I8 between a signal amount I6 of the detection region A6 and a signal amount I8 of the detection region A8 which is symmetric with the detection region A6 with respect to the center O.

Furthermore, a deflection direction of the electron beam EB by the electromagnetic field in the specimen can be specified from the difference I5-I7 and the difference I6-I8.

As described above, by calculating the deflection amount and the deflection direction of the electron beam by the electromagnetic field in the specimen using the DPC method and by imaging the calculated deflection amount and deflection direction, a DPC-STEM image can be acquired.

1.2. Method of Measuring Relative Rotational Angle

Subsequently, the method of measuring the relative rotational angle according to the first embodiment will be described.

1.2.1. Relative Rotational Angle

First, the relative rotational angle between the image plane on which the specimen is disposed and the diffraction plane on which the detector 150 is disposed will be described.

The image plane on which the specimen is disposed is formed on the specimen plane 2, and the diffraction plane on which the detector 150 is disposed is formed on the detection plane 4. On the image plane, data of the real space, that is, a specimen image (real image) is acquired, while on the diffraction plane, data of the reciprocal space, that is, an electron diffraction figure is acquired.

The relative rotational angle is a rotational angle of a coordinate system on the detection plane 4 (a coordinate O(q), which will be described later) with respect to a coordinate system on the specimen plane 2 (a coordinate O(r), which will be described later). The coordinate system on the specimen plane 2 is rotated by a lens action of the image-forming system lens and the scan rotation between the specimen plane 2 and the detection plane 4 and is transferred to the detection plane 4.

Figure 5:
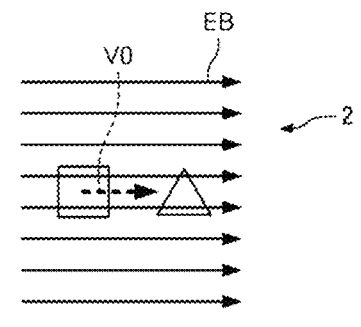
FIG. 5 is a diagram for explaining scan rotation.
Figure 5:
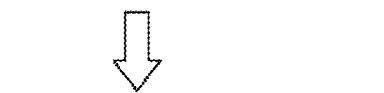
Figure 6:
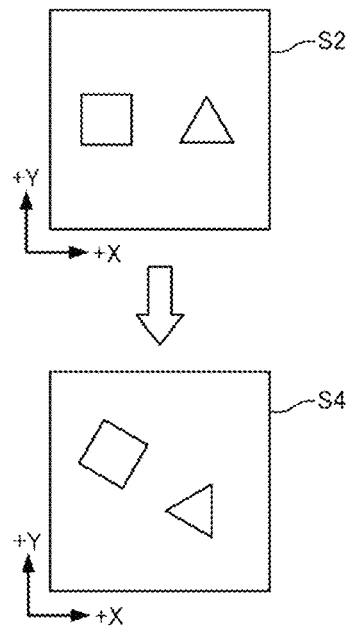
FIG. 6 is a diagram illustrating a STEM image before scan rotation and a STEM image after scan rotation.

FIG. 5 is a diagram for explaining the relative rotational angle. FIG. 6 is a diagram illustrating a STEM image (specimen image) S2 before the scan rotation and a STEM image (specimen image) S4 after the scan rotation.

In the scanning transmission electron microscope 100, as illustrated in FIG. 5, a scanning direction of the electron beam EB can be arbitrarily changed (scan rotation). For example, as illustrated in FIG. 6, suppose that a right direction on the STEM image S2 is a +X direction, and an upper direction on the STEM image S2 is a +Y direction. At this time, as illustrated in FIG. 5, the STEM image S4 is acquired by changing the scanning direction by the scan rotation. In the STEM image S4, a display direction of the image is changed as illustrated in FIG. 6. That is, a field of view of the STEM image S4 is rotated with respect to the field of view of the STEM image S2.

Figure 7:
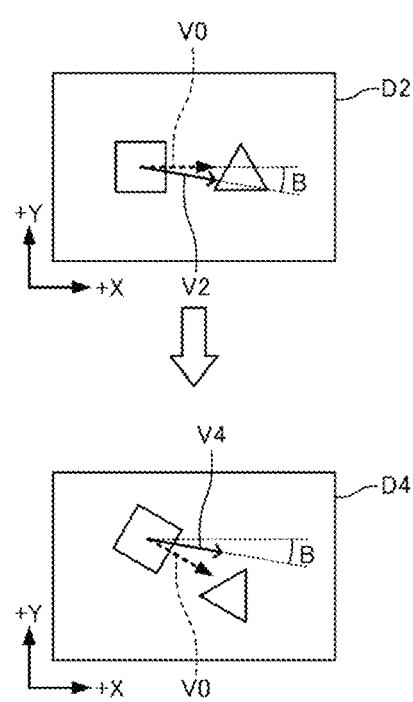
FIG. 7 is a diagram illustrating a DPC image before scan rotation and a DPC image after scan rotation.

FIG. 7 is a diagram illustrating a DPC image D2 before the scan rotation and a DPC image D4 after the scan rotation. Note that, in the DPC image D2, the deflection direction of the electron beam EB by the electromagnetic field in the specimen acquired by the DPC method is indicated by a vector V2, and in the DPC image D4, the deflection direction of the electron beam EB by the electromagnetic field in the specimen acquired by the DPC method is indicated by a vector V4.

As illustrated in FIG. 5, deflection of the electron beam EB on the specimen plane 2 by the electromagnetic field in the specimen is indicated by a vector V0. At this time, in the DPC image D2, the direction indicated by the vector V2 is shifted from the direction indicated by the vector V0 only by an angle B. This shift is generated by rotation of the image by the lens action of the image-forming system lens (the first image-forming system lens 140 and the second image-forming system lens 142).

Here, in the scanning transmission electron microscope 100, the direction of the specimen and the azimuth of the electron diffraction figure with respect to the entire optical system are not changed by the scan rotation. Therefore, in the DPC image D4 after the scan rotation, the direction indicated by the vector V4 is the same as the direction indicated by the vector V2. This means that a relative relationship between a drawing of the true electromagnetic-field vector V0 rotated by following the specimen coordinate and drawings of the measured electromagnetic-field vectors V2 and V4 calculated by a detector coordinate not influenced by the scan rotation is arbitrarily changed by a value of the scan rotation.

As described above, the coordinate system (coordinate O(r)) on the specimen plane 2 is rotated by the scan rotation. Thus, when the relative rotational angle is to be measured, in addition to the rotation of the image by the first image-forming system lens 140 and the second image-forming system lens 142, the rotation of the image by the scan rotation needs to be considered.

1.2.2. Method of Measuring Relative Rotational Angle

Subsequently, the method of measuring the relative rotational angle will be described.

As described above, in the scanning transmission electron microscope 100, the electron beam EB can be shifted on the specimen plane 2 by the simple shifting, and the electron beam EB can be shifted on the detection plane 4 by the simple tilting. Moreover, by using the detector 150, the direction of the shift of the electron beam EB on the specimen plane 2 by the simple shifting can be detected as movement of a field of view of the STEM image, and the direction of the shift of the electron beam EB on the detection plane 4 by the simple tilting can be detected by the DPC method. In the method of measuring the relative rotational angle according to the first embodiment, the relative rotational angle is measured by using them.

Figure 8:
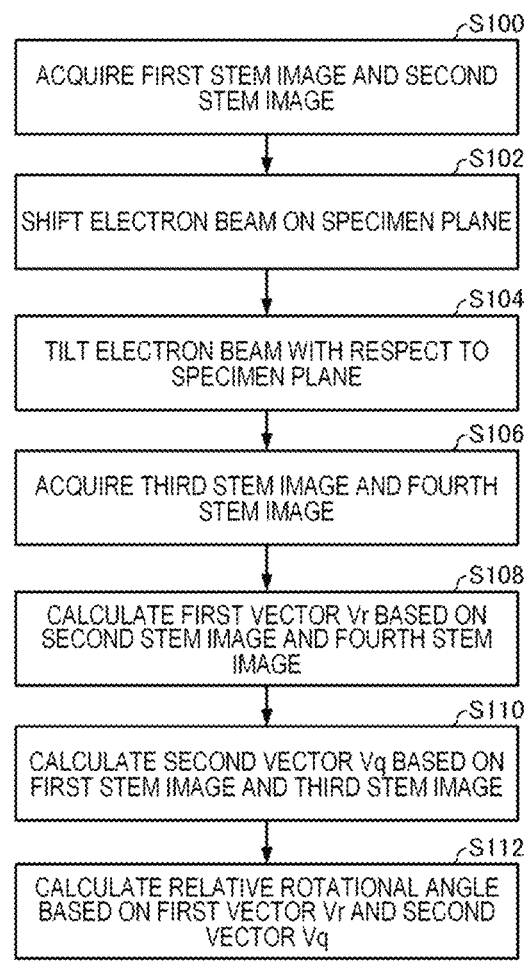
FIG. 8 is a flowchart illustrating an example of a method of measuring a relative rotational angle.

FIG. 8 is a flowchart illustrating an example of the method of measuring the relative rotational angle.

(1) Step S100 of Acquiring First STEM Image and Second STEM Image

Figure 9:
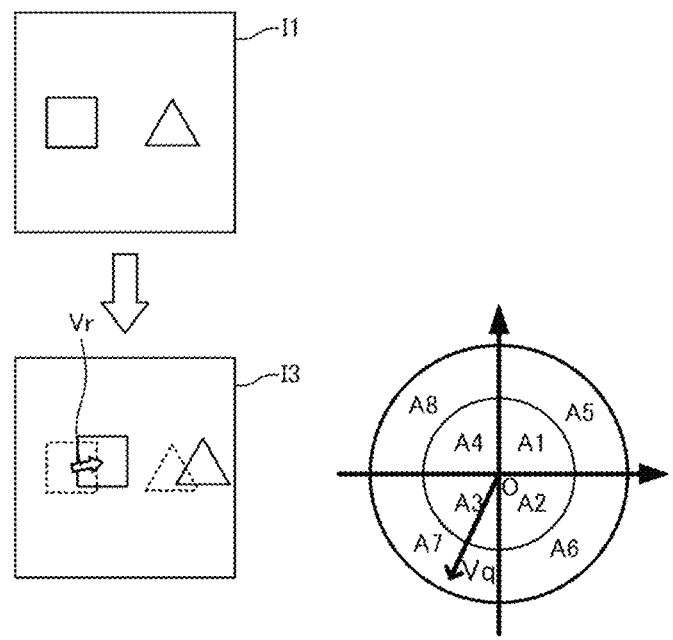
FIG. 9 is a diagram schematically illustrating a first STEM image and a third STEM image.
Figure 10:
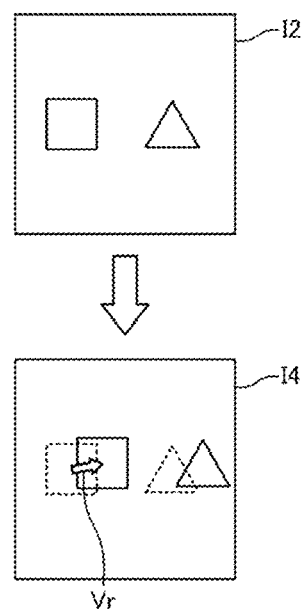
FIG. 10 is a diagram schematically illustrating a second STEM image and a fourth STEM image.

FIG. 9 is a diagram schematically illustrating a first STEM image I1 and a third STEM image I3. FIG. 10 is a diagram schematically illustrating a second STEM image I2 and a fourth STEM image I4.

First, the first STEM image I1 and the second STEM image I2 are acquired. The first STEM image I1 is a STEM image including information of the scattering azimuth angle of electrons scattered by the electromagnetic field in the specimen. The first STEM image I1 is a DPC-STEM image, for example. For convenience, in the first STEM image I1 illustrated in FIG. 9, illustration of arrows indicating a deflection direction and a deflection amount of the electron by the electromagnetic field in the specimen is omitted.

The second STEM image I2 is a STEM image not including the information of the scattering azimuth angle of electrons scattered by the electromagnetic field in the specimen. The second STEM image I2 only needs to be an image in which a shape of an edge in the specimen that can be observed clearly. The second STEM image I2 includes a bright-field STEM image (BF-STEM image), an annular bright-field image (ABF-STEM image), an annular dark-field image (ADF-STEM image), an eABF-STEM image, an MBF-STEM image and the like, for example.

The BF-STEM image is a STEM image acquired by detecting a transmitted beam of the electron diffraction figure. The ABF-STEM image is a STEM image acquired by selectively detecting only a peripheral part by an annular detector without using an optical-axis center part of a transmitted beam. The ADF-STEM image is a STEM image acquired by selectively detecting a diffraction wave by the annular detector. The eABF-STEM image is a STEM image acquired by subtracting the BF image from the ABF image. The MBF-STEM image is a STEM image acquired by adding the ABF image and the BF image together.

In this step, first, an illumination-system optical axis, an image-forming system optical axis, an interlocking ratio of the deflector 120, and the detector 150 are adjusted, and measurement is made in order to acquire a STEM image with the field of view, magnification, camera length, and scanning direction set by a user. That is, the space on the specimen is scanned with the electron beam EB, and the electron beam EB transmitted through the specimen is detected by the detector 150 under these optical conditions.

Subsequently, from detection signals acquired in each of the detection regions A1 to A8 of the detector 150, the first STEM image I1 and the second STEM image I2 are calculated. The first STEM image I1 is a DPC-STEM image and is calculated from the detection signals acquired in each of the detection regions A1 to A8 by using the aforementioned DPC method.

For example, if the second STEM image I2 is an MBF-STEM image, a total sum of the detection signals acquired in the detection regions A1 to A8 is acquired for each measurement point, and the STEM image is generated. As a result, the MBF-STEM image as the second STEM image I2 can be acquired.

(2) Shifting Step S102

Subsequently, the electron beam EB is subjected to the simple shifting by using the deflector 120. As a result, the electron beam EB is shifted on the specimen plane 2, while the electron beam EB is not shifted on the detection plane 4. That is, the field of view of the STEM image is shifted, but the deflection amount and the deflection direction of the electron beam EB in the DPC-STEM image are not changed.

(3) Tilting Step S104

Subsequently, the electron beam EB is subjected to the simple tilting by using the deflector 120. As a result, the electron beam EB is shifted on the detection plane 4, while the electron beam EB is not shifted on the specimen plane 2. That is, the field of view of the STEM image is not shifted, and the deflection amount and the deflection direction of the electron beam EB in the DPC-STEM image are changed in the entire field of view.

Figure 11:
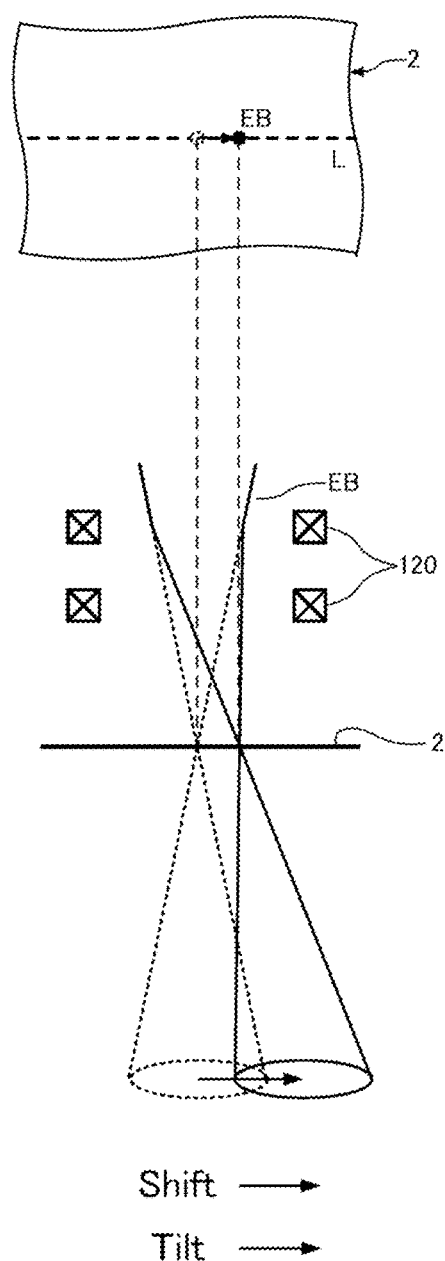
FIG. 11 is a diagram for explaining a shifting step and a tilting step.
Figure 12:
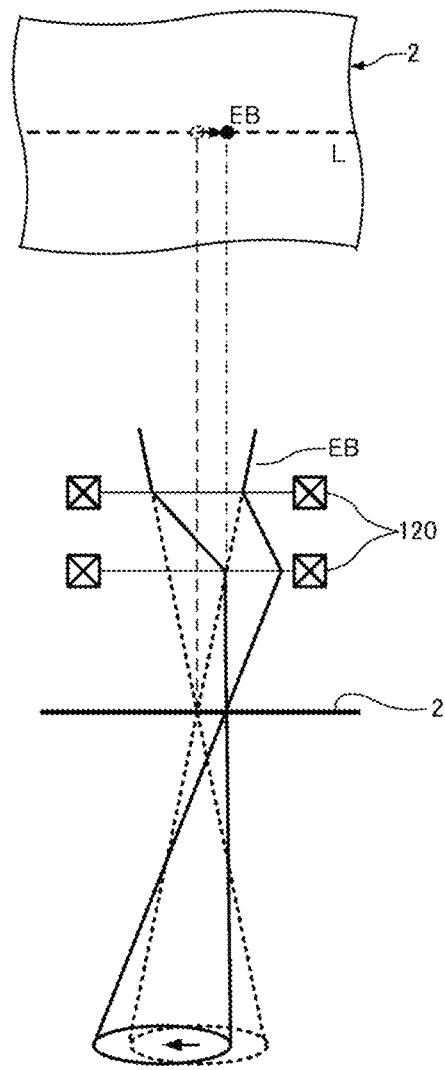
FIG. 12 is a diagram for explaining a shifting step and a tilting step.

FIGS. 11 and 12 are diagrams for explaining the shifting step S102 and the tilting step S104. In FIGS. 11 and 12, a plan view schematically illustrating the specimen plane 2 and a sectional view cut on a virtual straight line L are illustrated, respectively.

As illustrated in FIGS. 11 and 12, in the shifting step S102, the position of the electron beam EB is shifted on the virtual straight line L on the specimen plane 2, and in the tilting step S104, the electron beam EB is tilted on the same virtual straight line L. That is, in the tilting step S104, the electron beam EB is tilted along the straight line L indicating a trajectory of the electron beam EB on the specimen plane 2 when the electron beam EB was shifted in the shifting step S102.

There are two combinations of the shifting direction of the electron beam EB in the shifting step S102 and the tilting direction of the electron beam EB in the tilting step S104 as illustrated in FIGS. 11 and 12. That is, they are a case in which the shifting direction and the tilting direction of the electron beam EB are the same direction as illustrated in FIG. 11, and a case in which the shifting direction and the tilting direction of the electron beam EB are directions opposite to each other as illustrated in FIG. 12.

(4) Acquiring Step S106 of Third STEM Image and Fourth STEM Image

Subsequently, the third STEM image I3 and the fourth STEM image I4 are acquired. The third STEM image I3 is a STEM image including the information of the scattering azimuth angle acquired after the shifting step S102 and the tilting step S104. The fourth STEM image I4 is a STEM image not including the information of the scattering azimuth angle acquired after the shifting step S102 and the tilting step S104. Note that, for convenience, an arrow indicated in the third STEM image I3 illustrated in FIG. 9 illustrates only a shift of the electron beam EB on the detection plane 4 in the tilting step S104, and the deflection direction and the deflection amount of the electron by the electromagnetic field in the specimen are not considered.

In this step, first, under the same optical conditions as those in the step S100, measurement for acquiring a STEM image is conducted. That is, under the same optical conditions as those in the step S100, the space on the specimen is scanned with the electron beam EB, and the electron beam EB transmitted through the specimen is detected by the detector 150. Subsequently, from the detection signals acquired in each of the detection regions A1 to A8 of the detector 150, the third STEM image I3 is calculated with the same calculating method as that of the first STEM image I1, and the fourth STEM image I4 is calculated with the same calculating method as that of the second STEM image I2.

(5) Calculating Step S108 of First Vector Vr

Subsequently, based on the second STEM image I2 and the fourth STEM image I4, a first vector Vr representing a shift of the electron beam EB on the specimen plane 2 by the shifting step S102 is calculated.

For example, supposing a right-hand system orthogonal coordinate O(r) on the specimen plane 2 with the right direction on the second STEM image I2 (on the fourth STEM image I4) as a +X direction and an upper direction as a +Y direction, the first vector Vr is calculated under the coordinate O(r) from the shift in the field of view between the second STEM image I2 and the fourth STEM image I4.

As illustrated in FIG. 10, by shifting the electron beam EB in the shifting step S102, the field of view of the fourth STEM image I4 is shifted from the field of view of the second STEM image I2 on the specimen plane 2 by a portion by which the electron beam EB was shifted in the shifting step S102. Thus, by acquiring moving amounts and moving directions of the fields of view of the second STEM image I2 and the fourth STEM image I4, the first vector Vr can be acquired.

(6) Calculating Step S110 of Second Vector Vq

Subsequently, based on the first STEM image I1 and the third STEM image I3, a second vector Vq representing a shift of the electron beam EB on the detection plane 4 by the tilting step S104 is calculated.

For example, supposing a right-hand system orthogonal coordinate O(q) on the detection plane 4 determined by the direction of the detector 150, a difference between signals of the first STEM image I1 and the third STEM image I3 at the same spot is acquired, and the second vector Vq is calculated under the coordinate O(q). In the example in FIG. 4, for example, the +x direction of the coordinate O(q) is a direction from the detection region A4 toward the detection region A1, and the +y direction is a direction from the detection region A2 toward the detection region A1.

As illustrated in FIG. 9, by tilting the electron beam EB in the tilting step S104, the electron beam EB is shifted on the detection plane 4, and the deflection amount and the deflection direction of the electron beam EB indicated by the third STEM image I3 are changed on the entire field of view only by this shift portion. Thus, by acquiring a difference between signals of the first STEM image I1 and the third STEM image I3 at the same spot, the second vector Vq can be acquired.

(7) Calculating Step S112 of Relative Rotational Angle

Subsequently, based on the first vector Vr and the second vector Vq, the relative rotational angle is calculated.

Figure 13:
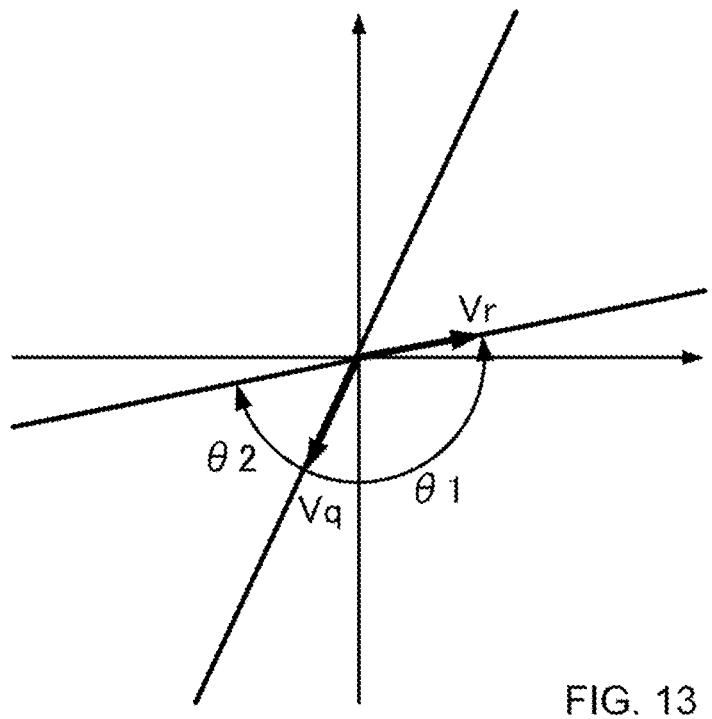
FIG. 13 is a diagram for explaining a method of calculating a relative rotational angle.

FIG. 13 is a diagram for explaining a method of calculating a relative rotational angle θ.

As illustrated in FIG. 13, on the coordinate O(r), the first vector Vr and the second vector Vq are drawn, and an angle formed by the first vector Vr and the second vector Vq is calculated.

Here, in the shifting step S102, the electron beam EB was shifted on the virtual straight line L on the specimen plane 2, and in the tilting step S104, the electron beam EB was tilted on the virtual straight line L. Thus, as illustrated in FIGS. 11 and 12, the first vector Vr and the second vector Vq should be directed to the same direction or to the directions opposite to each other on the coordinate O(r). Therefore, two angles can be considered as candidates for the relative rotational angle θ. That is, as the candidates for the relative rotational angle θ, an angle θ1 at which the first vector Vr and the second vector Vq are in the same direction and an angle θ2 at which the first vector Vr and the second vector Vq are in the directions opposite to each other can be cited.

For example, the angle θ1 or the angle θ2 may be selected based on the interlocking setting of the deflecting coils in two stages constituting the deflector 120, or the angle θ1 or the angle θ2 may be selected based on the optical system conditions of the scanning transmission electron microscope 100. Moreover, the user may select the angle θ1 or the angle θ2 based on the first to fourth STEM images I1 to I4, for example.

The angle θ1 or the angle θ2 selected as above is the relative rotational angle θ.

The relative rotational angle can be acquired by the steps described above.

By acquiring the relative rotational angle, rotation of the image by the image-forming system lens and rotation of the image by the scan rotation can be corrected. As a result, in the DPC-STEM image, for example, the direction of a specimen image can be associated with the scattering azimuth angle.

Figure 14:
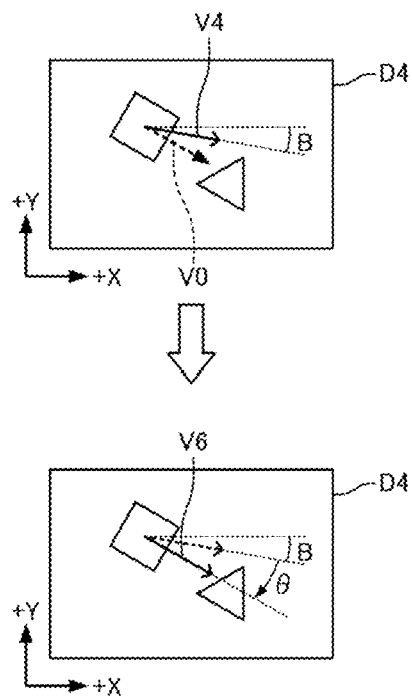
FIG. 14 is a diagram illustrating a state in which a vector representing deflection of an electron beam in a DPC image is corrected by using a relative rotational angle.

FIG. 14 is a diagram illustrating a state where a vector V4 representing deflection of the electron beam EB (that is, the scattering azimuth angle) in the DPC image D4 is corrected by using the relative rotational angle θ. In FIG. 14, the direction indicated by the vector V4 is corrected by the relative rotational angle θ, and it is represented by a vector V6.

As illustrated in FIG. 14, by correcting the direction of the vector V4 in the DPC image D4 by using the relative rotational angle θ, the vector V6 direction after the correction can be matched with the direction of the vector V0.

As described above, the measured relative rotational angle can be used as a correction angle for associating an azimuth of the real space formed on the specimen plane 2 with the azimuth of the reciprocal space formed on the detection plane 4.

Moreover, by performing the aforementioned measurement of the relative rotational angle after the scan rotation is performed, the scattering azimuth angle in the DPC-STEM image can be accurately known even after the scan rotation is performed.

1.3. Effect

The method of measuring the relative rotational angle according to the first embodiment includes the shifting step S102 of shifting the electron beam EB on the specimen plane 2 by using the deflector 120, the tilting step S104 of tilting the electron beam EB with respect to the specimen plane 2 by using the deflector 120, the step S100 of acquiring the first STEM image I1 including the information of the scattering azimuth angle and the second STEM image I2 not including the information of the scattering azimuth angle before the shifting step S102 and the tilting step S104, the step S106 of acquiring the third STEM image I3 including the information of the scattering azimuth angle and the fourth STEM image I4 not including the information of the scattering azimuth angle after the shifting step S102 and the tilting step S104, and the steps S108, S110, and S112 of acquiring the relative rotational angle based on the first STEM image I1, the second STEM image I2, the third STEM image I3, and the fourth STEM image I4. Thus, with the method of measuring the relative rotational angle according to the first embodiment, the relative rotational angle can be measured easily.

In the method of measuring the relative rotational angle according to the first embodiment, in the shifting step S102, the electron beam EB is shifted on the virtual straight line L on the specimen plane 2, and in the tilting step S104, the electron beam EB is tilted on the virtual straight line L. Thus, in the step S112 of calculating the relative rotational angle, the number of candidates for the relative rotational angle can be narrowed to two (the angle θ1 and the angle θ2 in FIG. 13).

In the method of measuring the relative rotational angle according to the first embodiment, the first STEM image I1 and the third STEM image I3 are differential phase contrast images. Thus, in the method of measuring the relative rotational angle according to the first embodiment, the relative rotational angle can be measured easily.

In the method of measuring the relative rotational angle according to the first embodiment, the step of acquiring the relative rotational angle includes the step S108 of acquiring the first vector Vr representing the shift of the electron beam EB on the specimen plane 2 by the shifting step S102 based on the second STEM image I2 and the fourth STEM image I4, the step S110 of acquiring the second vector Vq representing the shift of the electron beam EB on the detection plane 4 by the tilting step S104 based on the first STEM image I1 and the third STEM image I3, and the step S112 of acquiring the relative rotational angle based on the first vector Vr and the second vector Vq. Thus, with the method of measuring the relative rotational angle according to the first embodiment, the relative rotational angle can be measured easily.

1.4. Modification

Subsequently, a modification of a scanning transmission electron microscope used for the method of measuring the relative rotational angle according to the first embodiment will be described. In the following, points different from the example of the aforementioned scanning transmission electron microscope 100 will be described, while description will be omitted for the similar points.

1.4.1. First Modification

The detector 150 may include a rotation mechanism for rotating the detection plane 4. That is, the direction of the detector 150 may be changeable. For example, the detection plane 4 of the detector 150 may be rotatable around the center O as a rotation center.

Figure 15:
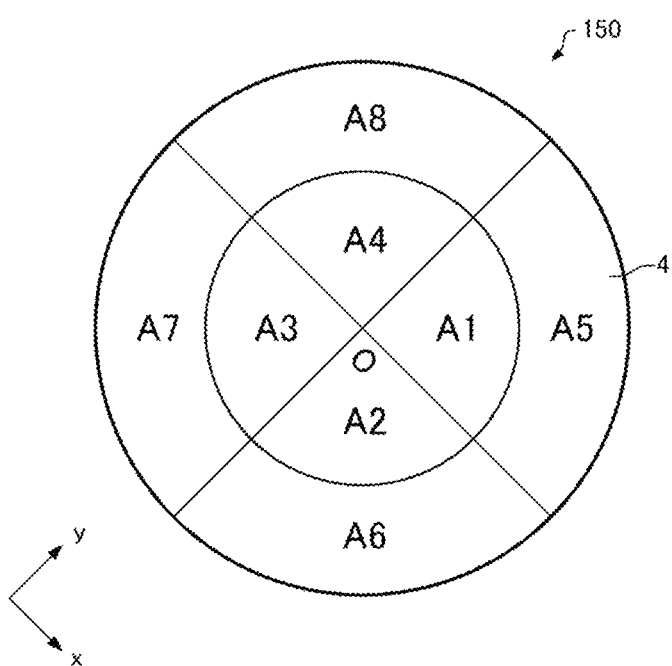
FIG. 15 is a diagram schematically illustrating a detection plane of a detector.

FIG. 15 is a diagram schematically illustrating the detection plane 4 of the detector 150. In FIG. 15, the detection plane 4 illustrated in FIG. 4 is rotated clockwise by 45 degrees. At this time, an x-axis and a y-axis of the coordinate O(q) are also rotated clockwise by 45 degrees.

As described above, even when the detection plane 4 is rotatable, the relative rotational angle can be calculated with the procedure similar to the method of measuring the relative rotational angle according to the aforementioned first embodiment.

1.4.2. Second Modification

Figure 16:
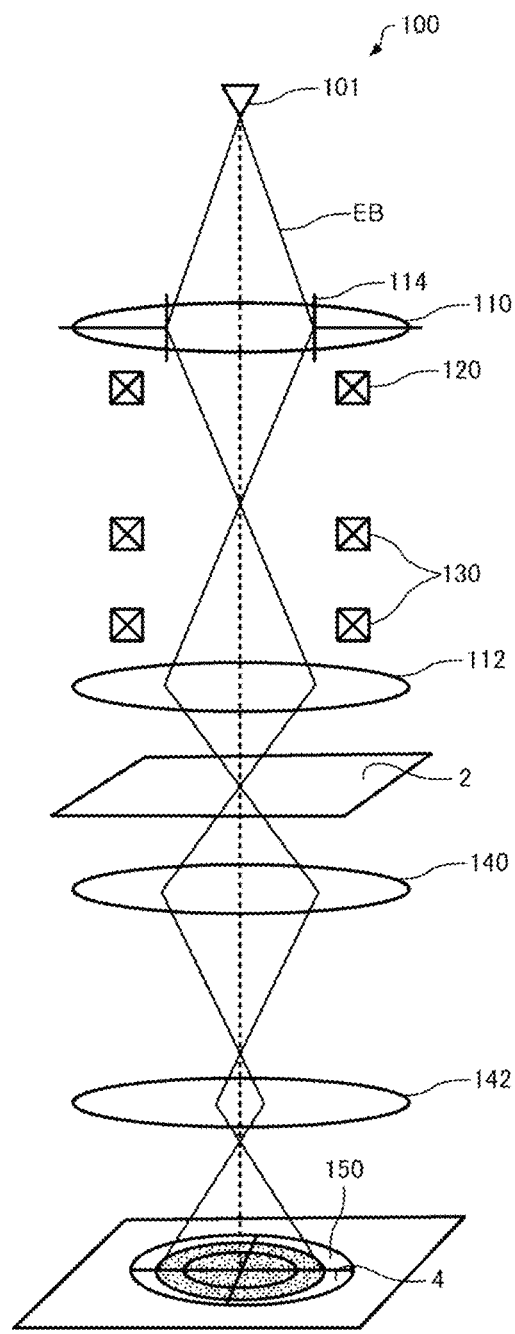
FIG. 16 is a diagram for explaining a modification of a scanning transmission electron microscope.

FIG. 16 is a diagram for explaining a modification of the scanning transmission electron microscope 100.

In the aforementioned scanning transmission electron microscope 100 illustrated in FIG. 1, the deflector 120 is constituted by the deflecting coils in two stages, but as illustrated in FIG. 16, the deflector 120 may be constituted by the deflecting coils in one stage. With the deflecting coils in one stage, the electron beam EB cannot be subjected to the simple shifting or the simple tilting, and when the electron beam EB is shifted on the specimen plane 2, the electron beam EB is tilted with respect to the specimen plane 2. When the deflector 120 is constituted by the deflecting coils in one stage, the shifting step S102 and the tilting step S104 are performed at the same time.

Even when the deflector 120 is constituted by the deflecting coils in one stage, the relative rotational angle can be calculated with the procedure similar to the aforementioned method of measuring the relative rotational angle according to the first embodiment except the point that the shifting step S102 and the tilting step S104 are performed at the same time.

1.5. Experiment Example

Hereinafter, the invention will be described by illustrating an experiment example. Note that the invention is not limited at all by the following experiment example.

First, the DPC-STEM image and the MBF-STEM image were acquired before and after the shifting step and the tilting step.

Figure 17:
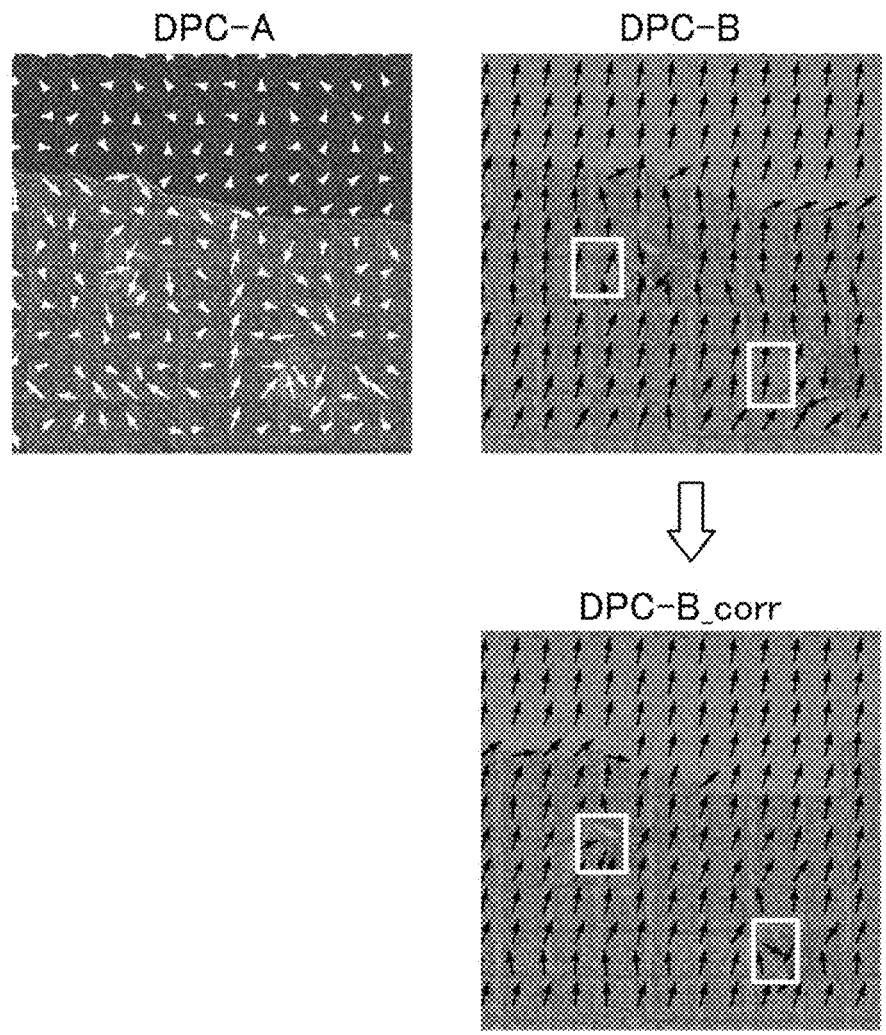
FIG. 17 is a DPC-STEM image before and after a shifting step and a tilting step.
Figure 18:
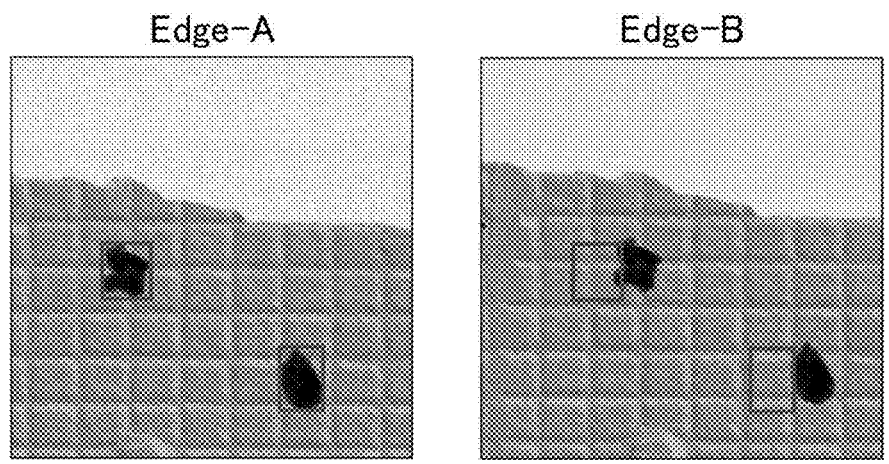
FIG. 18 is an MBF-STEM image before and after a shifting step and a tilting step.
Figure 19:
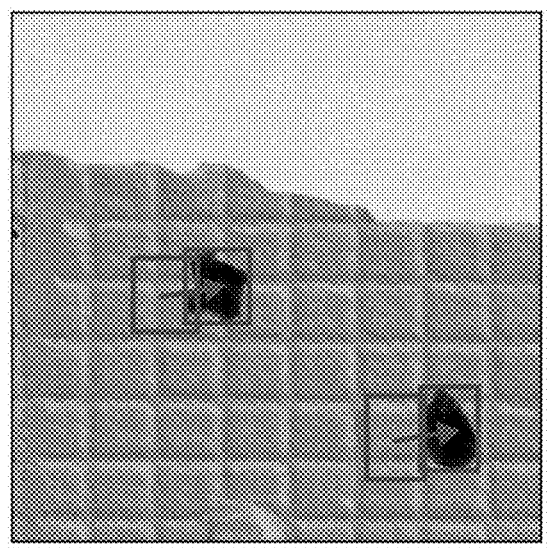
FIG. 19 is a diagram for explaining a step of measuring a relative rotational angle.
Figure 20:
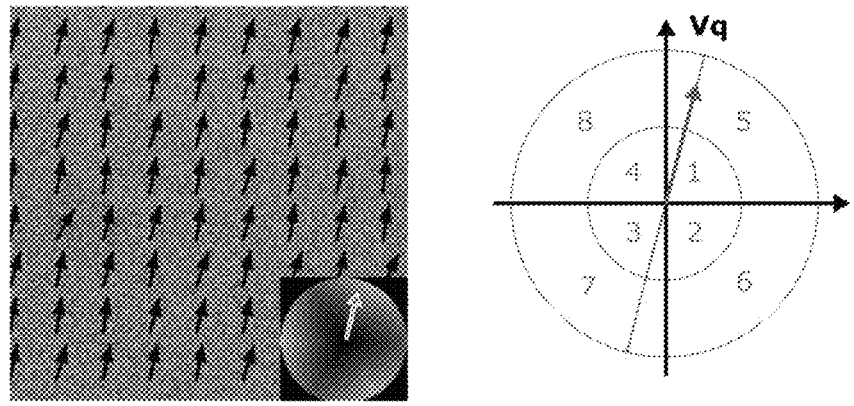
FIG. 20 is a diagram for explaining a step of measuring a relative rotational angle.
Figure 21:
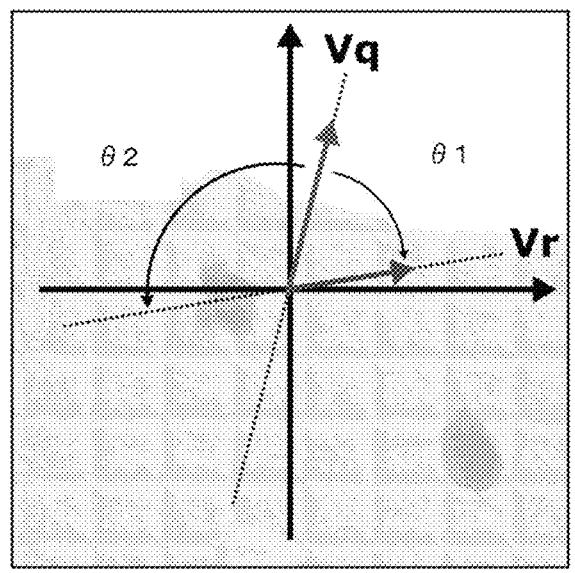
FIG. 21 is a diagram for explaining a step of measuring a relative rotational angle.

FIG. 17 illustrates the DPC-STEM image before and after the shifting step and the tilting step, and FIG. 18 illustrates the MBF-STEM image before and after the shifting step and the tilting step. FIGS. 19 to 21 are diagrams for explaining a step of measuring the relative rotational angle.

An image DPC-A illustrated in FIG. 17 is the DPC-STEM image before the shifting step and the tilting step, and an image DPC-B is the DPC-STEM image after the shifting step and the tilting step. Moreover, an image Edge-A illustrated in FIG. 18 is the MBF-STEM image before the shifting step and the tilting step and an image Edge-B is the MBF-STEM image after the shifting step and the tilting step.

Note that the DPC-STEM image is a STEM image generated by the DPC method. In the image DPC-A and the image DPC-B, the scattering azimuth angle is indicated by a color of a pixel and an arrow on the image.

The MBF-STEM image is a STEM image in which intensity of each pixel is expressed by the total sum of the detection signals of all the measurement regions of the split-type detector at a measurement point corresponding to each pixel.

In the image DPC-B, since the electron beam was subjected to the simple shifting in the shifting step, a view-field displacement is generated with respect to the image DPC-A. Similarly, in the image Edge-B, since the electron beam was subjected to the simple shifting in the shifting step, the view-field displacement is generated with respect to the image Edge-A.

Moreover, in the image DPC-B, since the electron beam was subjected to the simple tilting in the tilting step, such a state is brought about that uniform offset of the DPC signal is applied to the image DPC-A.

On the other hand, in the image Edge-B, since an image forming method is hardly influenced by the simple tilting of the electron beam in the tilting step, an effect of the simple tilting is not shown.

Subsequently, as illustrated in FIG. 19, the first vector Vr was calculated from the image Edge-A and the image Edge-B. The first vector Vr indicates offset of a field of view of the image Edge-B with respect to the image Edge-A.

Subsequently, as illustrated in FIG. 20, the second vector Vq was calculated from the image DPC-A and the image DPC-B. Specifically, first, the view-field displacement between the image DPC-A and the image DPC-B was corrected. The view-field displacement between the image DPC-A and the image DPC-B can be corrected by using the first vector Vr. An image DPC-B_corr is an image of a result of correction of the view-field displacement in the image DPC-B by using the first vector Vr. Subsequently, an average of the DPC signals in the acquired differential vector images was calculated by subtracting the image DPC-A from the image DPC-B_corr. As a result, the second vector Vq representing the shift of the electron beam on the detection plane by the tilting step was calculated.

By using the image DPC-B_corr, the view-field displacement between the image DPC-A and the image DPC-B is corrected and thus, deflection of the electron beam caused by the specimen in the differential vector image is cancelled. Therefore, ideally, only the signals caused by the tilting step appears in the differential vector image, whereby a uniform image is acquired.

Note that, in the differential vector image in FIG. 20, an influence of dusts on the specimen could not be cancelled. However, in the differential vector image in FIG. 20, since a uniform differential signal region is sufficiently wide, calculation of the second vector Vq was hardly influenced.

As illustrated in FIG. 21, the first vector Vr and the second vector Vq were drawn on the right-hand system orthogonal coordinate O(r) on the specimen plane. Here, in the tilting step, the electron beam was tilted along a straight line indicating a trajectory when the electron beam was shifted in the shifting step. Thus, the first vector Vr and the second vector Vq should be directed to the same direction or in the directions opposite to each other on the coordinate O(r). Therefore, candidates for the relative rotational angle could be narrowed to two, that is, the angle θ1 and the angle θ2.

Figure 22:
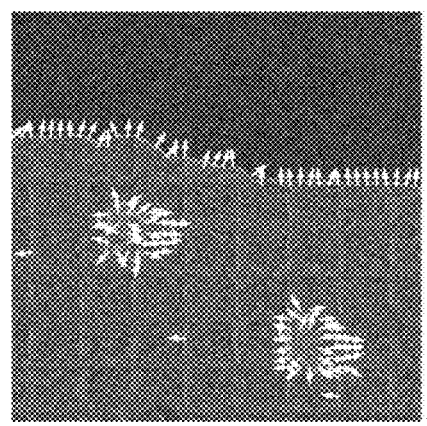
FIG. 22 is a DPC-STEM image in which a relative rotational angle is corrected.

FIG. 22 is a diagram illustrating a DPC-STEM image in which the relative rotational angle was corrected.

The angle θ1 was selected as the relative rotational angle so that the DPC-STEM image illustrated in FIG. 22 in which the relative rotational angle was finally corrected is correctly displayed. As a result, the relative rotational angle could be measured. In the DPC-STEM image in FIG. 22, it is known that the acquired relative rotational angle was an appropriate value from the scattering azimuth angle of the electron on a boundary between the specimen and a vacuum portion and the scattering azimuth angle of the electron in the dust on a grating.

2. Second Embodiment 2.1. Scanning Transmission Electron Microscope

Figure 23:
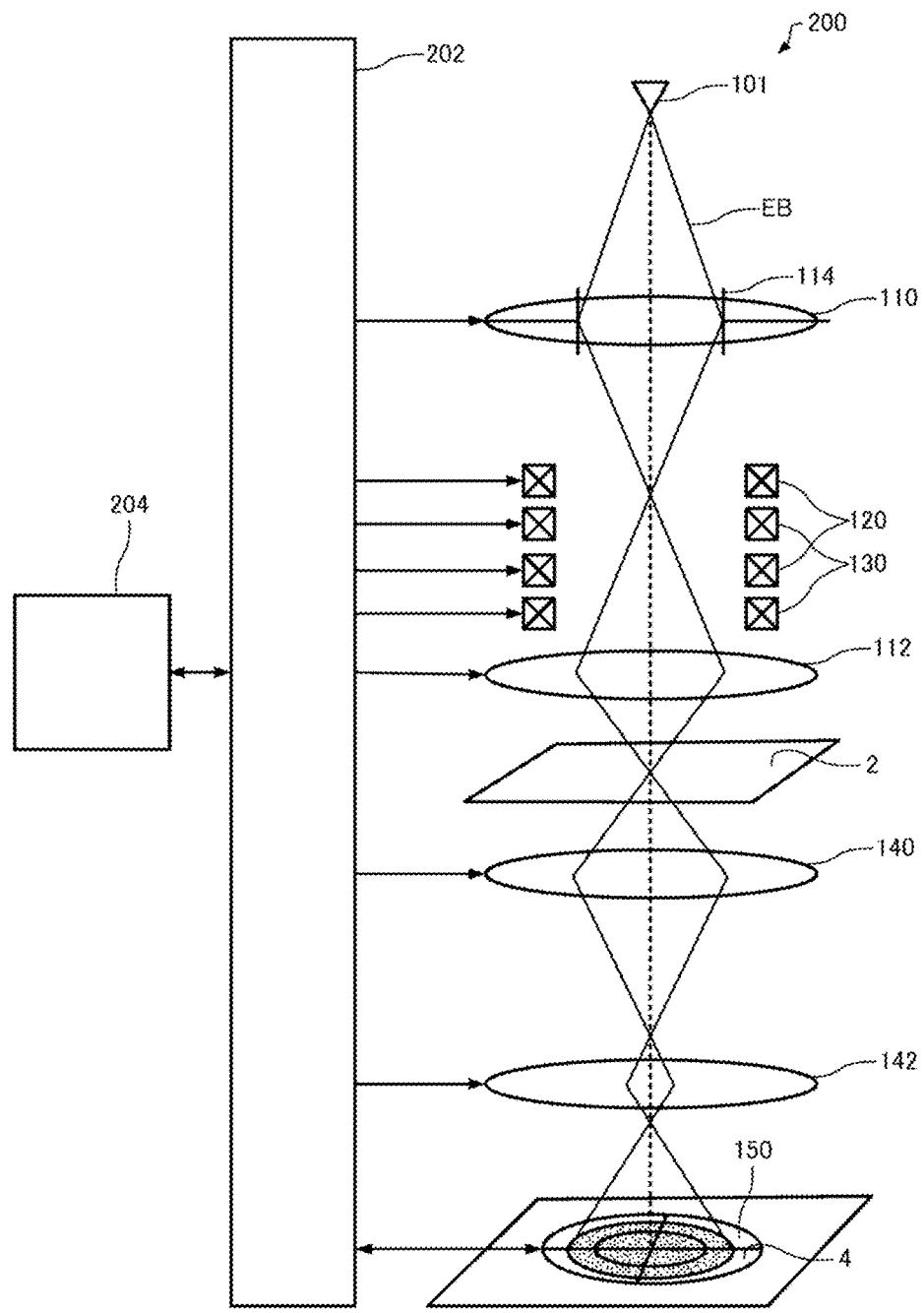
FIG. 23 is a diagram illustrating a configuration of a scanning transmission electron microscope according to the second embodiment.

Subsequently, a scanning transmission electron microscope according to the second embodiment will be described by referring to the figures. FIG. 23 is a diagram illustrating a configuration of the scanning transmission electron microscope 200 according to a second embodiment. Hereinafter, in the scanning transmission electron microscope 200 according to the second embodiment, the members having the function similar to those of the constituent members of the scanning transmission electron microscope 100 described above are given the same signs, and detailed explanation thereof will be omitted.

The scanning transmission electron microscope 200 includes a control device 202 and an information processing device 204 as illustrated in FIG. 23. In the scanning transmission electron microscope 200, measurement of the relative rotational angle can be performed automatically.

The control device 202 controls each part of the scanning transmission electron microscope 200. The information processing device 204 generates a control signal for controlling each part of the scanning transmission electron microscope 200 and sends the generated control signal to the control device 202. The control device 202 controls each part of the scanning transmission electron microscope 200 based on the control signal.

The control device 202 receives the detection signal of each of the detection regions A1 to A8 of the detector 150 and sends it to the information processing device 204. The information processing device 204 generates various STEM images by using the detection signal of each of the detection regions A1 to A8.

Figure 24:
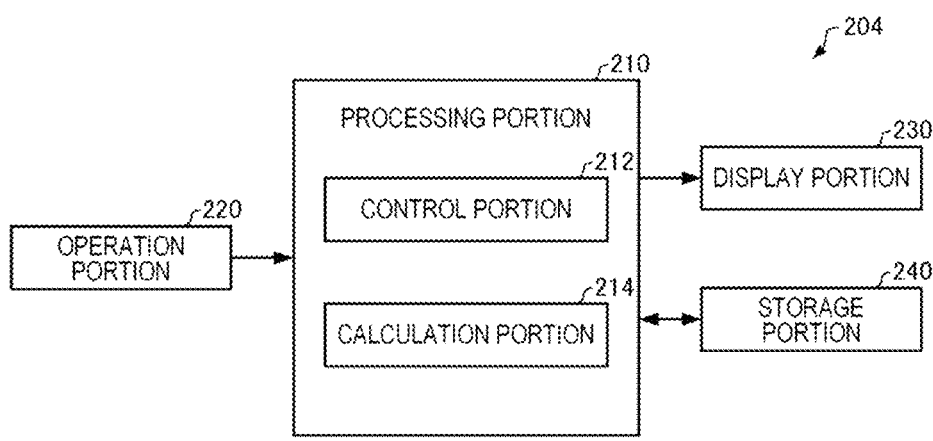
FIG. 24 is a diagram illustrating a configuration of an information processing device.

FIG. 24 is a diagram illustrating configuration of the information processing device 204.

The information processing device 204 includes a processing portion 210, an operation portion 220, a display portion 230 and a storage portion 240.

The operation portion 220 is a portion for a user to input operation information and outputs the input operation information to the processing portion 210. A function of the operation portion 220 can be realized by hardware such as a keyboard, a mouse, a button, a touch panel, a touch pad and the like.

The display portion 230 displays an image generated by the processing portion 210. A function of the display portion 230 can be realized by an LCD, a CRT, and the touch panel which functions also as the operation portion 220.

The storage portion 240 stores programs and various types of data which cause the computer to function as each part of the processing portion 210. Moreover, the storage portion 240 functions also as a work area of the processing portion 210. A function of the storage portion 240 can be realized by hard disk, a RAM (Random Access Memory) and the like.

A function of the processing portion 210 (computer) can be realized by executing the program on the hardware such as various processors (a CPU, a DSP and the like). The processing portion 210 includes a control portion 212 and a calculation portion 214.

The control portion 212 generates a control signal for controlling each part of the scanning transmission electron microscope 200. The control portion 212 performs processing of acquiring a STEM image by controlling each part of the scanning transmission electron microscope 200, for example.

The calculation portion 214 generates various STEM images based on the detection signal of each of the detection regions A1 to A8 of the detector 150. Moreover, the calculation portion 214 calculates the relative rotational angle.

2.2. Operation

Subsequently, an operation of the scanning transmission electron microscope 200 will be described. In the scanning transmission electron microscope 200, the relative rotational angle can be measured automatically.

Figure 25:
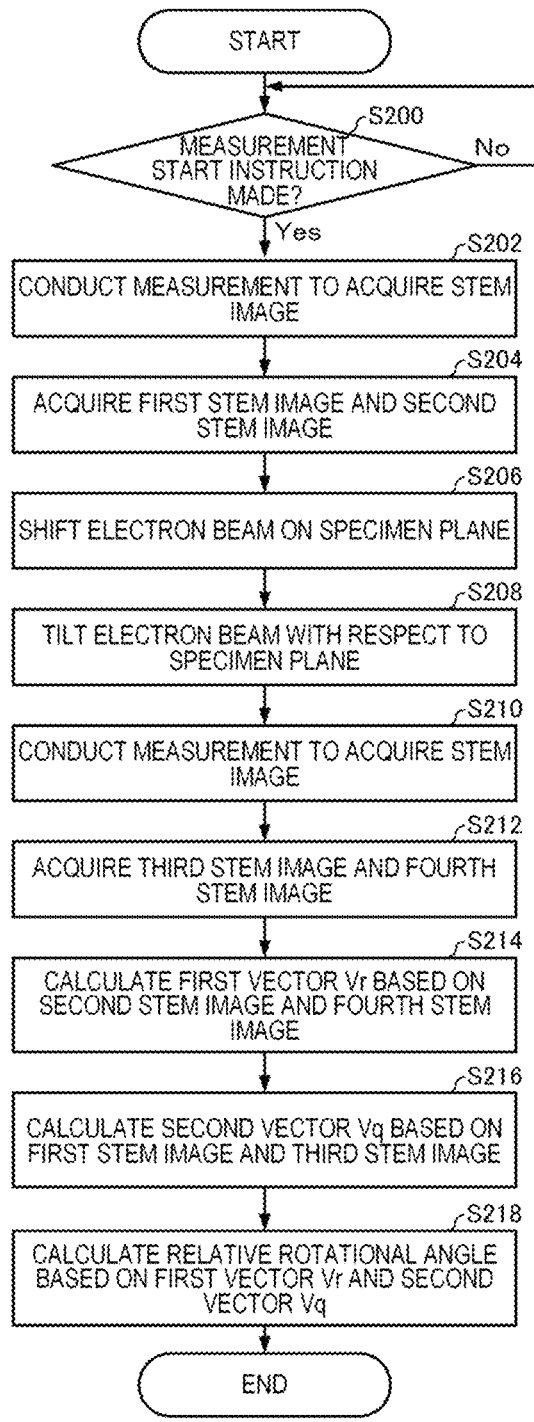
FIG. 25 is a flowchart illustrating an example of processing of measuring a relative rotational angle.

FIG. 25 is a flowchart illustrating an example of processing of measuring the relative rotational angle of the processing portion 210.

First, the control portion 212 determines whether the user instructed to start measurement of the relative rotational angle (measurement start instruction) or not (S200). When the measurement start instruction is input via the operation portion 220, the control portion 212 determines that the user made the measurement start instruction.

When it is determined that the measurement start instruction was made (Yes at S200), the control portion 212 conducts measurement in order to acquire a STEM image (S202). As a result, the space above the specimen is scanned with the electron beam EB under the set optical conditions, and the electron beam EB transmitted through the specimen is detected by the detector 150. The detection signal of each of the detection regions A1 to A8 of the detector 150 is sent to the information processing device 204.

The calculation portion 214 generates the first STEM image I1 and the second STEM image I2 based on the detection signal of each of the detection regions A1 to A8 (S204). As a result, the first STEM image I1 and the second STEM image I2 can be acquired.

Subsequently, the control portion 212 causes the deflector 120 to perform the simple shifting to the electron beam EB (S206). Subsequently, the control portion 212 causes the deflector 120 to perform the simple tilting to the electron beam EB (S208).

Subsequently, the control portion 212 conducts measurement for acquiring the STEM image (S210), and the calculation portion 214 generates the third STEM image I3 and the fourth STEM image I4 (S212). As a result, the third STEM image I3 and the fourth STEM image I4 can be acquired.

The calculation portion 214 calculates the first vector Vr based on the second STEM image I2 and the fourth STEM image I4 (S214). The calculation portion 214 calculates the second vector Vq based on the first STEM image I1 and the third STEM image I3 (S216).

The calculation portion 214 calculates the relative rotational angle based on the first vector Vr and the second vector Vq (S218).

For example, the calculation portion 214 selects one of the two angles formed by the first vector Vr and the second vector Vq as the relative rotational angle based on the interlocking setting and the optical conditions of the deflector 120. Note that the calculation portion 214 may present both the two angles formed by the first vector Vr and the second vector Vq as candidates for the relative rotational angle to the user.

After the calculation portion 214 calculates the relative rotational angle (after S218), the processing portion 210 ends the processing of measuring the relative rotational angle.

In the above, the processing portion 210 starts the processing of measuring the relative rotational angle in response to the user's measurement start instruction, but the processing portion 210 may start the processing of measuring the relative rotational angle at timing when the scan rotation is performed. As a result, in the DPC-STEM image acquired after the scan rotation is performed, the scattering azimuth angle can be known accurately.

2.3. Effect

In the scanning transmission electron microscope 200, the relative rotational angle can be acquired automatically.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A method of measuring, in a scanning transmission electron microscope (STEM) comprising a deflector that deflects an electron beam with which a specimen is illuminated and a detector that is configured to detect a scattering azimuth angle of electrons scattered by an electromagnetic field of the specimen, a relative rotational angle between an image plane on which the specimen is disposed and a diffraction plane on which the detector is disposed, the method comprising:
    shifting the electron beam on a specimen plane by using the deflector;
    tilting the electron beam with respect to the specimen plane by using the deflector;
    acquiring a first STEM image comprising information of the scattering azimuth angle and a second STEM image not comprising the information of the scattering azimuth angle, before the shifting and the tilting;
    acquiring a third STEM image comprising the information of the scattering azimuth angle and a fourth STEM image not comprising the information of the scattering azimuth angle, after the shifting and the tilting; and
    obtaining the relative rotational angle based on the first STEM image, the second STEM image, the third STEM image and the fourth STEM image.

2. The method of measuring the relative rotational angle according to claim 1, wherein
    in the shifting, an electron beam is shifted on a virtual straight line on the specimen plane; and
    in the tilting, the electron beam is tilted on the virtual straight line.

3. The method of measuring the relative rotational angle according to claim 1, wherein
    the first STEM image and the third STEM image are differential phase contrast images.

4. The method of measuring the relative rotational angle according to claim 1, wherein
    the second STEM image and the fourth STEM image are bright-field STEM images, annular bright-field images, annular dark-field images, eABF-STEM images or MBF-STEM images.

5. The method of measuring the relative rotational angle according to claim 1, wherein
the obtaining of the relative rotational angle comprises:
obtaining a first vector indicating a shift of the electron beam on the specimen plane in the shifting, based on the second STEM image and the fourth STEM image;
obtaining a second vector indicating a shift of the electron beam on a detection plane in the tilting, based on the first STEM image and the third STEM image; and
obtaining the relative rotational angle based on the first vector and the second vector.

6. A scanning transmission electron microscope comprising:
an illumination-system lens through which a specimen is illuminated with an electron beam;
a deflector that deflects the electron beam with which the specimen is illuminated;
an image-forming system lens that forms an image with the electron beam transmitted through the specimen;
a detector that is configured to detect a scattering azimuth angle of electrons scattered by an electromagnetic field of the specimen; and
a calculation portion that calculates a relative rotational angle between an image plane on which the specimen is disposed and a diffraction plane on which the detector is disposed,
the calculation portion performing processing of:
acquiring a first STEM image including information of the scattering azimuth angle and a second STEM image not comprising the information of the scattering azimuth angle, the information having been acquired before the electron beam is shifted on a specimen plane by using the deflector and tilted with respect to the specimen plane by using the deflector;
acquiring a third STEM image comprising the information of the scattering azimuth angle and a fourth STEM image not comprising the information of the scattering azimuth angle, the information having been acquired after the electron beam is shifted on the specimen plane by using the deflector and tilted with respect to the specimen plane by using the deflector; and
obtaining the relative rotational angle based on the first STEM image, the second STEM image, the third STEM image and the fourth STEM image.

7. The scanning transmission electron microscope according to claim 6, wherein
the first STEM image and the third STEM image are differential phase contrast images.

8. The scanning transmission electron microscope according to claim 6, wherein
the second STEM image and the fourth STEM image are bright-field STEM images, annular bright-field images, annular dark-field images, eABF-STEM images or MBF-STEM images.

9. The scanning transmission electron microscope according to claim 6, wherein
the obtaining of the relative rotational angle comprises:
obtaining a first vector indicating a shift of the electron beam on the specimen plane caused by shifting the electron beam on the specimen plane based on the second STEM image and the fourth STEM image;
obtaining a second vector indicating a shift of the electron beam on a detection plane caused by tilting the electron beam with respect to the specimen plane based on the first STEM image and the third STEM image; and
obtaining the relative rotational angle based on the first vector and the second vector.

* * * * *